United States Patent
Kim (10) Patent No.: US 12,352,798 B2
(45) Date of Patent: Jul. 8, 2025

(54) GROUND SENSING PLUG FOR DETERMINING THE AMOUNT OF ELECTROSTATIC DISCHARGE USING A NEURAL NETWORK

(71) Applicant: Worldhomedoctor Corp., Anyang-si (KR)

(72) Inventor: Jiyoun Kim, Anyang-si (KR)

(73) Assignee: Worldhomedoctor Corp., Anyang-si (KR)

( * ) Notice: Subject to any disclaimer, the term of this patent is extended or adjusted under 35 U.S.C. 154(b) by 209 days.

(21) Appl. No.: 18/326,320

(22) Filed: May 31, 2023

(65) Prior Publication Data

US 2024/0319255 A1 Sep. 26, 2024

(30) Foreign Application Priority Data

Mar. 23, 2023 (KR) .......................... 10-2023-0037830

(51) Int. Cl.
*G01R 31/14* (2006.01)
*G01R 29/12* (2006.01)
(Continued)

(52) U.S. Cl.
CPC ............. *G01R 31/14* (2013.01); *G01R 29/12* (2013.01); *G06N 3/0442* (2023.01); *G06N 3/08* (2013.01);
(Continued)

(58) Field of Classification Search
CPC ...... G01R 31/14; G01R 29/12; G06N 3/0442; G06N 3/08; H01R 13/665; H01R 13/7175;
(Continued)

(56) References Cited

U.S. PATENT DOCUMENTS 11,854,938 B2 * 12/2023 Li .......................... H02H 9/046
12,070,324 B2 * 8/2024 Shin ..................... A61B 5/1126
(Continued)

FOREIGN PATENT DOCUMENTS

KR 10-2019-0034798 A 4/2019
KR 10-2021-0026674 A 3/2021
(Continued)

OTHER PUBLICATIONS

Korean Office Action for KR 10-2023-0037830 dated May 23, 2023.

*Primary Examiner* — Huy Q Phan
*Assistant Examiner* — Trung Q Nguyen
(74) *Attorney, Agent, or Firm* — Sughrue Mion, PLLC (57) ABSTRACT

Embodiments present a ground sensing plug for determining the amount of electrostatic discharge using a neural network. The ground sensing plug may include a first plug terminal configured to receive power from a power outlet connected thereto, a second plug terminal configured to have two recesses exposed to an outside to perform a function of an earth terminal, a controller including at least one processor, a memory, a communication unit, and circuitry electrically connected to the first plug terminal and the second plug terminal, and a display including a display panel and a plurality of light emitting diodes electrically connected to the circuitry, the plurality of light emitting diodes including a first light emitting diode, a second light emitting diode, and a plurality of third light emitting diodes, and emit green light based on a grounded state being detected, and a housing arranged to enclose the controller.

5 Claims, 6 Drawing Sheets (51) Int. Cl.
    *G06N 3/0442*     (2023.01)
    *G06N 3/08*     (2023.01)
    *H01R 13/66*     (2006.01)
    *H01R 13/717*     (2006.01)
    *H01R 24/68*     (2011.01)
    *H01R 103/00*     (2006.01)

(52) U.S. Cl.
    CPC ....... *H01R 13/665* (2013.01); *H01R 13/7175* (2013.01); *H01R 24/68* (2013.01); *H01R 2103/00* (2013.01); *H01R 2201/20* (2013.01)

(58) Field of Classification Search
    CPC . H01R 24/68; H01R 2103/00; H01R 2201/20
    USPC .............................. 324/500, 600, 76.11, 457
    See application file for complete search history.

(56) References Cited

U.S. PATENT DOCUMENTS

| | | | | |
|---|---|---|---|---|
| 2008/0290591 | A1* | 11/2008 | Shimizu | B65H 43/00 |
| | | | | 271/208 |
| 2014/0167799 | A1* | 6/2014 | Wang | G01R 1/36 |
| | | | | 361/220 |
| 2022/0166170 | A1* | 5/2022 | Gordon | H01R 13/652 |
| 2022/0395033 | A1* | 12/2022 | Stevenson | A61N 1/14 |

FOREIGN PATENT DOCUMENTS

| | | |
|---|---|---|
| KR | 10-2468638 B1 | 11/2022 |
| KR | 10-2023-0024931 A | 2/2023 |

\* cited by examiner

GROUND SENSING PLUG FOR DETERMINING THE AMOUNT OF ELECTROSTATIC DISCHARGE USING A NEURAL NETWORK

CROSS-REFERENCE TO RELATED APPLICATION

This application claims priority to and the benefit of Korean Patent Application No. 10-2023-0037830, filed on Mar. 23, 2023, the disclosure of which is incorporated herein by reference in its entirety.

BACKGROUND

1. Field of the Invention

Embodiments of the present disclosure relate to a ground sensing plug for determining the amount of electrostatic discharge using a neural network.

2. Description of the Related Art

A plug, a type of electrical wiring device, is a wiring device that connects to the end of a cord connected to an electrical appliance and plugs into a power outlet, and the electricity supplied to a home or factory is directed to the power outlet.

An earth is a wire that connects an electrical device to the ground to keep the potential of the device at zero to prevent electricity-related accidents such as electric shock.

In the case of a conventional plug, such an earth terminal is not present. Even when the earth terminal is present, it is difficult to determine whether it is properly connected to the earth ground.

Furthermore, when a user sleeps on an earthing mat connected to the ground sensing plug after grounding, it is difficult for the user to visually recognize the amount of static electricity emitted from the user's body.

Therefore, there is a need for a ground sensing plug that allows a user to check the grounding status without additional equipment, and that can accurately calculate the amount of static electricity emitted by the user during the sleeping period such that the amount may be visually checked.

SUMMARY OF THE INVENTION

Embodiments of the present disclosure may provide a ground sensing plug for determining the amount of electrostatic discharge using a neural network.

Objects to be achieved in the embodiments are not limited to those mentioned above, and other objects will become apparent to those of ordinary skill in the art from various embodiments of the present disclosure described below.

In accordance with an aspect of the present disclosure, a ground sensing plug for determining an amount of electrostatic discharge using a neural network may include: a first plug terminal configured to receive power from a power outlet connected thereto; a second plug terminal configured to have two recesses exposed to an outside to perform a function of an earth terminal; a controller including at least one processor, a memory, a communication unit, and circuitry electrically connected to the first plug terminal and the second plug terminal; and a display including a display panel and a plurality of light emitting diodes electrically connected to the circuitry, the plurality of light emitting diodes including a first light emitting diode, a second light emitting diode, and a plurality of third light emitting diodes, each of the plurality of light emitting diodes being configured to provide emitted light of a single color, and emit green light based on a grounded state being detected by the ground sensing plug; and a housing arranged to enclose the controller.

In one example, the controller may be configured to: acquire, based on the plurality of light emitting diodes emitting green light, information about an amount of static electricity and information about temperature and humidity through a sensor unit connected to the ground sensing plug; receive, based on the plurality of light emitting diodes emitting the green light, physical information about a user from a user terminal of the user having a connection established with the ground sensing plug; determine information about an amount of electrostatic discharge from the user through an electrostatic discharge amount determination model using the neural network, based on the information about the amount of static electricity, the information about the temperature and humidity, and the physical information about the user; and display on the display an amount of static electricity discharged by the user during a sleeping time of the user based on the information about the amount of electrostatic discharge from the user.

In one example, based on the amount of static electricity discharged from the user during the sleeping time being greater than or equal to a reference value, an alert message may be transmitted to the user terminal. The sleeping time may be determined as a period of time from a first time when a pressure sensed by the sensor unit is greater than or equal to a preset value to a second time when the pressure sensed by the sensor unit is determined to be less than or equal to a preset value. The alert message may contain information about the sleeping time of the user, a normal amount of electrostatic discharge for the user, and an amount of discharged static electricity exceeding the normal amount of electrostatic discharge.

In one example, the information about the amount of static electricity may include a value for the amount of static electricity per body region of the user measured by the sensor unit during the sleeping time and a value for a distance between the user and the sensor unit. A body region having a greatest value of the measured amount of static electricity and a value for a coordinate region having a greatest value of the amount of static electricity in the body region may be determined based on the amount of static electricity per body region of the user. The alert message may further contain the body region having the greatest value of the measured amount of static electricity and the value for the coordinate region having the greatest value of the amount of static electricity in the body region.

According to one embodiment, the ground sensing plug may further include an earth leakage detector and an emergency battery. The earth leakage detector may be configured to: detect a leakage current around the connected power outlet; and based on the leakage current being detected around the connected power outlet, cut off power supplied to the ground sensing plug from the connected power outlet. Based on the power supplied to the ground sensing plug being cut off, a leakage notification message may be transmitted to the user terminal using power supplied by the emergency battery.

In one example, the information about the temperature and humidity may include a temperature measured by the sensor unit during the sleeping time and a humidity measured by the sensor unit during the sleeping time. In this case, the temperature and humidity may be measured per body region of the user, and the information about the temperature and humidity may include the temperature per body region of the user measured by the sensor unit during the sleeping time, and the humidity per body region of the user measured by the sensor unit during the sleeping time. The physical information about the user may include a height of the user, a weight of the user, a gender of the user, an age of the user, a value for an average heart rate of the user, and a value for an average oxygen saturation of the user.

In one example, an input vector may be generated by data preprocessing of the information about the amount of static electricity, the information about the temperature and humidity, and the physical information about the user. The input vector may include changing values for the amount of static electricity per body region of the user, a value for the distance between the user and the sensor unit, a temperature value at the time when the amount of static electricity per body region of the user changes, a humidity value at the time when the amount of static electricity per body region of the user changes, the value for the height of the user, the value for the weight of the user, the value for the gender of the user, the value for the age of the user, the value for the average heart rate of the user, and the value for the average oxygen saturation of the user. The neural network may include an input layer, one or more hidden layers, and an output layer. Training data each including a plurality of input vectors and a plurality of correct amount of electrostatic discharge from each body region is input to the input layer of the neural network and passed through the one or more hidden layers and output layer to provide an output vector. The output vector may be input to a loss function layer connected to the output layer, and the loss function layer may output a loss value using a loss function configured to compare the output vector with a correct vector for each of the training data. Parameters of the neural network may be trained such that the loss value is reduced. Based on the input vector being input to the electrostatic discharge amount determination model, a total amount of electrostatic discharge from the user and the amount of electrostatic discharge from each body region of the user may be output. The information about the amount of electrostatic discharge from the user may include the total amount of electrostatic discharge from the user for the sleeping time and the amount of electrostatic discharge from each body region of the user for the sleeping time.

Additionally, for example, the ground sensing plug may determine whether the total amount of electrostatic discharge from the user for the sleeping time is greater than or equal to a first reference value.

For example, the first reference value may be determined by the following equation.

$$E_{th1} = \left(1.75 - \frac{5\alpha * h^2 * r_d - r * w}{w * r_d}\right) * \frac{V_{d1}}{1 + m * \sqrt{c}},$$

where $E_{th1}$ may be the first reference value, a may be a weight based on the age of the user and the gender of the user, h may be a value for the height of the user, w may be a value for the weight of the user, r may be a value for the distance between the sensor unit and the user, $r_d$ may be a default value for the distance, m may be a value for the humidity, c may be a value for the temperature, and $V_{d1}$ may be a default voltage for the first reference value.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION OF THE INVENTION

The following embodiments are combinations of components and features of the embodiments in a predetermined form. Each component or feature may be considered optional unless explicitly stated otherwise. Each component or feature may be implemented without being combined with other components or features. In addition, various embodiments may be configured by combining some components and/or features. The order of operations described in various embodiments may be changed. Some components or features of one embodiment may be included in another embodiment, or may be replaced with corresponding components or features of another embodiment.

In the description of the drawings, procedures or steps that may obscure the gist of various embodiments are not described, and procedures or steps that may be understood by those skilled in the art are not described.

Throughout the specification, when a part is described as "comprising" or "including" a component, it is meant to be inclusive of other components, not exclusive of other components, unless specifically stated to the contrary. Terms such as "unit," "-er," and "module," refer to a unit for processing at least one function or operation, which may be implemented in hardware, software, or a combination thereof. As used herein, articles "a or an," "one," "the," and similar related words are intended to include both the singular form and the plural form in the context of describing various embodiments (particularly in the context of the appended claims) unless otherwise indicated herein or clearly contradicted by the context.

Hereinafter, embodiments according to various examples will be described in detail with reference to the accompanying drawings. The detailed description set forth below in conjunction with the accompanying drawings is intended to describe exemplary embodiments of various examples, and is not intended to present one and only one embodiment.

In addition, specific terms used in various embodiments are provided to facilitate understanding of various embodiments. These specific terms may be changed into other forms without departing from the spirit of various embodiments.

Figure 1:
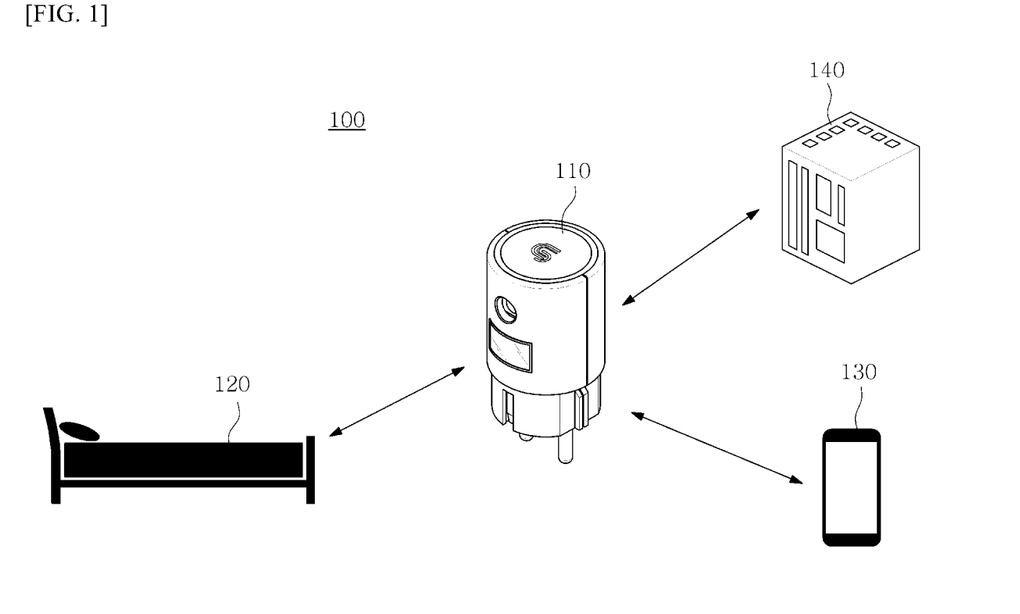
FIG. 1 is a diagram illustrating a system including a ground sensing plug for determining the amount of electrostatic discharge using a neural network, according to one embodiment.

FIG. 1 is a diagram illustrating a system including a ground sensing plug for determining the amount of electrostatic discharge using a neural network, according to one embodiment. The embodiment of FIG. 1 may be combined with various other embodiments of the present disclosure.

Referring to FIG. 1, the system including a ground sensing plug for determining the amount of electrostatic discharge using a neural network (hereinafter referred to as a system 100) may include a ground sensing plug 110, an earthing mat 120, a user terminal 130, and a management server 140.

The ground sensing plug 110 is a plug that detects whether the power outlet to which the plug is connected is properly grounded. For example, the ground sensing plug 110 may indicate whether the plug is connected to an earth terminal (earthing plug) and may display different colors of light depending on whether it is electrically connected to the earth terminal. For example, when the ground sensing plug 110 is electrically connected to the earth terminal, the ground sensing plug 110 may be configured to emit green light through a light emitter provided inside the ground sensing plug 110. Additionally, when the ground sensing plug 110 connected to the power outlet is not electrically connected to the earth terminal, the ground sensing plug 110 may be configured to emit red light through the light emitter provided inside the ground sensing plug 110.

The earthing mat 120 may be a mat electrically connected to the ground sensing plug 110 to produce an effect that makes users feel as if they are resting or sleeping on natural soil. The earthing mat 120 may discharge static electricity accumulated in the body caused by contact of the human body with the fabric included in the earthing mat 120 and introduce free electrons into the body, thereby removing free radicals and the like from the user's body and preventing acidification of the body, thereby promoting the health of the user. For example, the earthing mat 120 includes a fabric made of a fiber fabric or a quilted fabric and having an outer circumference stitched such that a space is formed inside, a first silk fabric provided in a lower layer of the fabric and having a hard surface, a sensor unit provided in an upper layer of the first silk and including an electrostatic measurement sensor configured to measure in a non-contact manner the static electricity generated when the body and the fabric come into contact, an earthing member formed of an electrically conductive material provided on an upper layer of the first silk fabric and configured to absorb static electricity generated when the body and the fabric come into contact, a second silk fabric provided on an upper layer of the earthing member and having a soft surface to protect the earthing member and provide cushioning to the user, and an earthing wire connected to the earthing member to discharge static electricity to the outside. Here, the sensor unit may detect an operational state of the device (e.g., the amount of static electricity or pressure), or an ambient state of the environment outside (e.g., temperature or humidity), and generate an electrical signal or data value corresponding to the detected state. According to one embodiment, the sensor unit may include, for example, a gyro sensor, a barometric pressure sensor, a magnetic sensor, an electrostatic detection sensor, an infrared (IR) sensor, a temperature sensor, or a humidity sensor.

The user terminal 130 may be a user's terminal that employs the ground sensing plug. For example, the user terminal 130 may be implemented as a variety of devices, including a smartphone, cell phone, smart TV, set-top box, tablet PC, laptop computer, desktop, and wearable device.

The management server 140 is a server that manages the amount of electrostatic discharge of the user based on information about the amount of electrostatic discharge determined by the ground sensing plug 110. The management server 140 may communicate with at least one of the ground sensing plug 110, the earthing mat 120, or the user terminal 130 over a local area network and/or a far-area wireless communication network. For example, the management server 140 may exchange information with the ground sensing plug 110, the earthing mat 120, and the user terminal 130, and may transmit signals for specific instructions.

For example, the sensor unit included in the earthing mat 120 may include an electrostatic detection sensor to detect the amount of static electricity, an IR sensor to measure the distance between the user and the sensor unit, a temperature sensor to measure the ambient temperature, and a humidity sensor to measure an ambient humidity. The earthing mat 120 may transmit information about the amount of static electricity measured by the sensor unit, information about the temperature, and information about the humidity to the ground sensing plug 110.

For example, the user terminal 130 may transmit externally input physical information about the user to the ground sensing plug 110 with which a connection has been established.

For example, the ground sensing plug 110 may determine the information about the amount of electrostatic discharge from the user through a model for determining the amount of electrostatic discharge using a neural network based on the information about the amount of electrostatic discharge, information about temperature and humidity, and physical information about the user. Based on the information about the amount of electrostatic discharge from the user, the ground sensing plug 110 may display the amount of static electricity discharged by the user during the sleeping time on a display provided in the ground sensing plug 110. Here, the display may visually present the information to an external party (e.g., the user). For example, the display may include a display panel, a holographic device, or control circuitry for controlling the device. For example, the display may include a touch sensor configured to detect a touch, or a pressure sensor configured to measure the strength of a force generated by the touch.

For example, the ground sensing plug 110, the earthing mat 120, the user terminal 130, and the management server 140 may each include a processor, a memory, and a communication unit.

The processor may control at least one other component (e.g., hardware or software component) of the device connected to the processor by executing software and may perform various data processing or operations. According to an embodiment, as at least part of the data processing or operation, the processor may store instructions or data received from other components (e.g., the sensor unit or the communication unit) in a volatile memory, process the instructions or data stored in the volatile memory, and store the result data in a nonvolatile memory. According to an embodiment, the processor may include a main processor (e.g., a central processing unit or an application processor) or an auxiliary processor (e.g., a graphic processing unit, a neural processing unit (NPU), an image signal processor, a sensor hub processor, or a communication processor).

The artificial intelligence model may be generated through machine learning. This learning may be performed by, for example, the device (e.g., the ground sensing plug 110) on which the artificial intelligence model is performed, or may be performed through a separate server (e.g., the management server 140). Learning algorithms may include, for example, supervised learning, unsupervised learning, semi-supervised learning, or reinforcement learning, but are not limited to the examples mentioned above. The artificial intelligence model may include a plurality of artificial neural network layers. The artificial neural network may be one of a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-networks, or a combination of two or more thereof, but are not limited to the examples mentioned above. In addition to the hardware structure, the artificial intelligence model may additionally or alternatively include a software structure.

The memory may store various data used by at least one component of the device (e.g., the processor). The data may include, for example, software and input data or output data for instructions related thereto. The memory may include a volatile memory or a nonvolatile memory.

The communication unit may support establishing a direct (e.g., wired) communication channel or wireless communication channel between the device and an external device, and performing communication on the established communication channel. The communication unit may include one or more communication processors that operate independently of the processor and support direct (e.g., wired) communication or wireless communication. According to an embodiment, the communication unit may include a wireless communication unit (e.g., a cellular communication unit, a short-range wireless communication unit, a global navigation satellite system (GNSS) communication unit), or a wired communication unit (e.g., a local area network (LAN) communication unit or a power line communication unit). Among these communication units, a corresponding communication unit may communicate with the external device over the first network (e.g., a short-range communication network such as Bluetooth, wireless fidelity (WiFi) direct, or infrared data association (IrDA)) or the second network (e.g., a remote communications network such as a legacy cellular network, a 5G network, a next-generation communications network, the Internet, or a computer network (e.g., LAN or WAN)). These various types of communication units may be integrated into one component (e.g., a single chip), or may be implemented as multiple separate components (e.g., multiple chips).

As used herein, a neural network and a network function may have the same meaning. A neural network may consist of a set of interconnected computational units, which may generally be referred to as "nodes." These "nodes" may also be referred to as "neurons". The neural network includes at least two or more nodes. The nodes (or neurons) constituting the neural networks may be interconnected by one or more "links."

Within the neural network, two or more nodes connected through a link may relatively establish a relationship of an input node and an output node. The concept of an input node and an output node is relative. Any node serving as an output node with respect to one node may be an input node with respect to another node, or vice versa. As described above, the input node-to-output node relationship may be created around a link. One or more output nodes may be connected to one input node through a link, and vice versa.

In the relationship between an input node and an output node connected through one link, a value of the output node may be determined based on data input to the input node. Here, a node interconnecting the input node and the output node may have a weight. The weight may be variable, and may be varied by a user or an algorithm in order for the neural network to perform a desired function. For example, when one or more input nodes are connected to one output node by their respective links, the output node may determine the output node value based on the values input to the input nodes connected to the output node and the weights set on the links corresponding to the respective input nodes.

As described above, two or more nodes are interconnected through one or more links to establish form an input node-output node relationship within the neural network. The characteristics of a neural network may be determined according to the number of nodes and links in the neural network, the association between the nodes and the links, and the value of the weight assigned to each of the links. For example, when there are the same number of nodes and links, and two neural network networks with different weights for the links, the two neural network networks may be recognized as different from each other.

Figure 2:
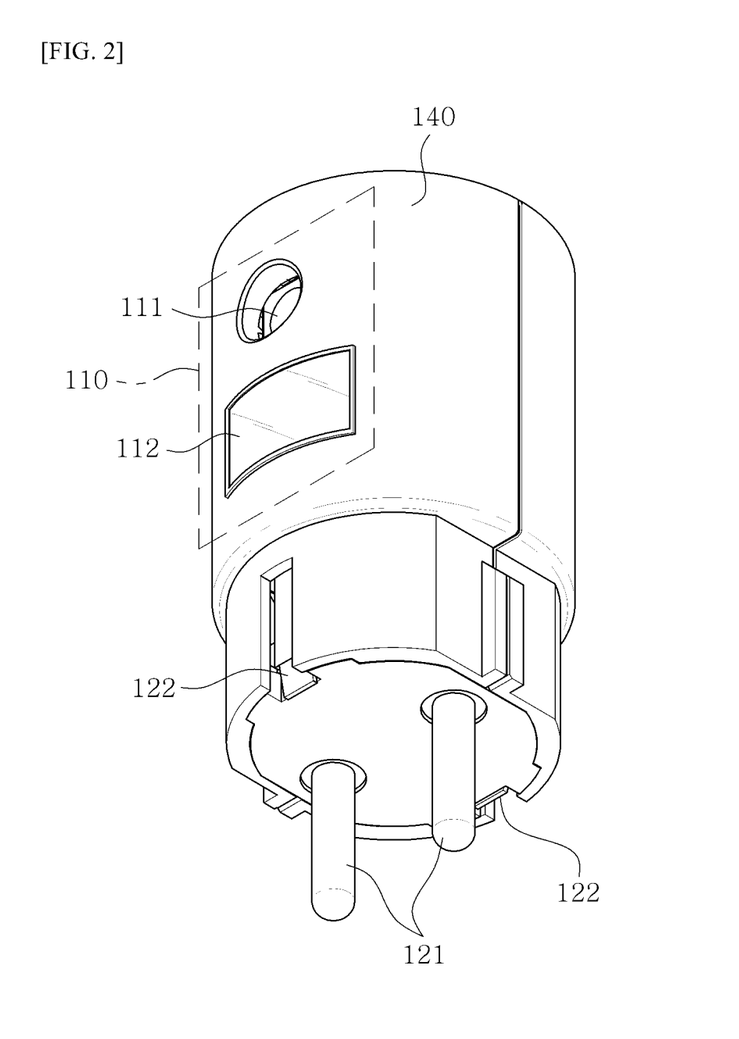
FIG. 2 is a schematic perspective view of a ground sensing plug for determining the amount of electrostatic discharge using a neural network, according to one embodiment.
Figure 3:
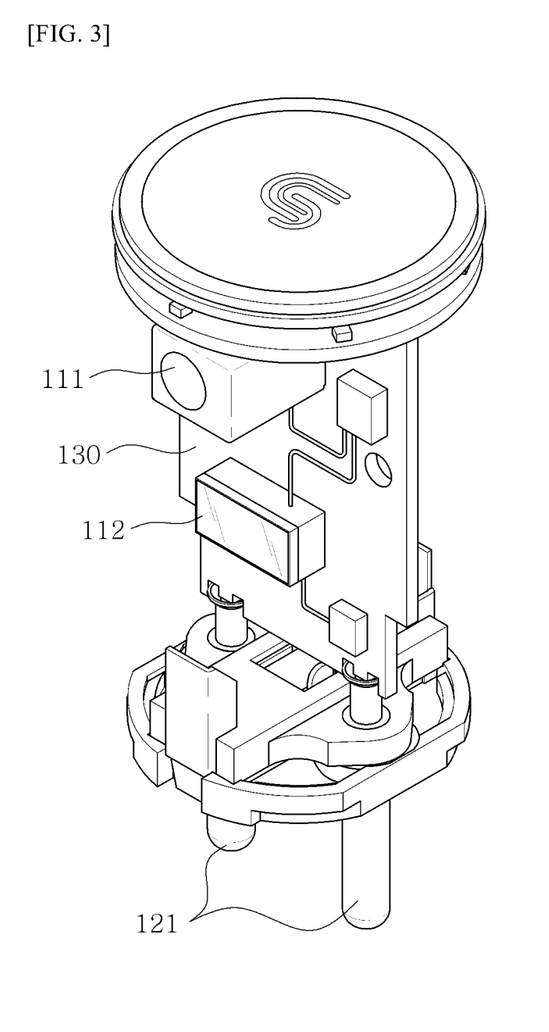
FIG. 3 is a view illustrating the internal structure of the ground sensing plug of FIG. 2, according to one embodiment.

FIG. 2 is a schematic perspective view of a ground sensing plug for determining the amount of electrostatic discharge using a neural network, according to one embodiment. FIG. 3 is a view illustrating the internal structure of the ground sensing plug of FIG. 2, according to one embodiment. The embodiments of FIGS. 2 and 3 may be combined with various other embodiments of the present disclosure.

Referring to FIGS. 2 and 3, when the ground sensing plug is electrically connected to the earth terminal, it may be configured to emit green light through the light emitting portion 111 of the display 110 provided in the ground sensing plug. That is, the plurality of light emitting diodes may emit green light based on being detected as grounded by the ground sensing plug. Further, when the ground sensing plug connected to the outlet is not electrically connected to the earth terminal, a red light may be configured to be emitted through the light emitter 111 of the display 110 provided on the ground sensing plug.

For example, the ground sensing plug may include a display 110, plug terminals 121 and 122, a controller 130, and a housing 140.

The plug terminals 121 and 122 may include a first plug terminal 121 to receive power directly from a power outlet and a second plug terminal 122 to contact a earth pin formed on the plug. For example, the first plug terminal 121 may be formed to have two protrusions and the second plug terminal 122 may be formed to have two recesses.

The controller 130 may include at least one processor, a memory, and a communication unit, and may have circuitry to control the emission of light in a different color (e.g., red or green) through the light emitter 111 of the display 110 depending on whether the second plug terminal 122 of the ground sensing plug is connected to the earth terminal, or whether the power outlet connected to the ground sensing plug is connected to the earth terminal.

The display 110 may include a light emitter 111 and a display panel 112. For example, the light emitter 111 may emit light of at least two colors. For example, the light emitter 111 may emit red or green light as described above. The light emitter 111 may include a plurality of light emitting diodes (LEDs). The display 110 may be connected to the controller 130. For example, the display panel 112 is a device for displaying visual information to a user, which may be a liquid crystal display (LCD) panel or alight emitting diode (LED) panel. The display panel 112 may include a touch portion. For example, the display panel 112 may recognize a user's touch via the touch portion. For example, the touch portion may recognize a user's touch (or approach) via a pressure sensitive electrode, a capacitive electrode, and/or multiple sensors.

The housing 140 may be a case that encloses the controller 130. The housing 140 may have the controller 130 disposed inside and may be configured to expose the display 110 and plug terminals 121 and 122 to the outside.

For example, based on the green light being emitted, the controller 130 may acquire information about the amount of static electricity and information about temperature and humidity via the sensor unit connected to the ground sensing plug. For example, based on the green light being emitted, the controller 130 may receive physical information about the user from the user terminal having established a connection with the ground sensing plug. Based on the information about the amount of electrostatic discharge, the information about the temperature and humidity, and the physical information about the user, the controller 130 may determine the information about the amount of electrostatic discharge from the user through a model for determining the amount of electrostatic discharge using a neural network. Based on the information about the amount of electrostatic discharge from the user, the controller 130 may display the amount of electrostatic discharge emitted by the user during the sleeping time on the display panel 112 of the display 110.

Figure 4:
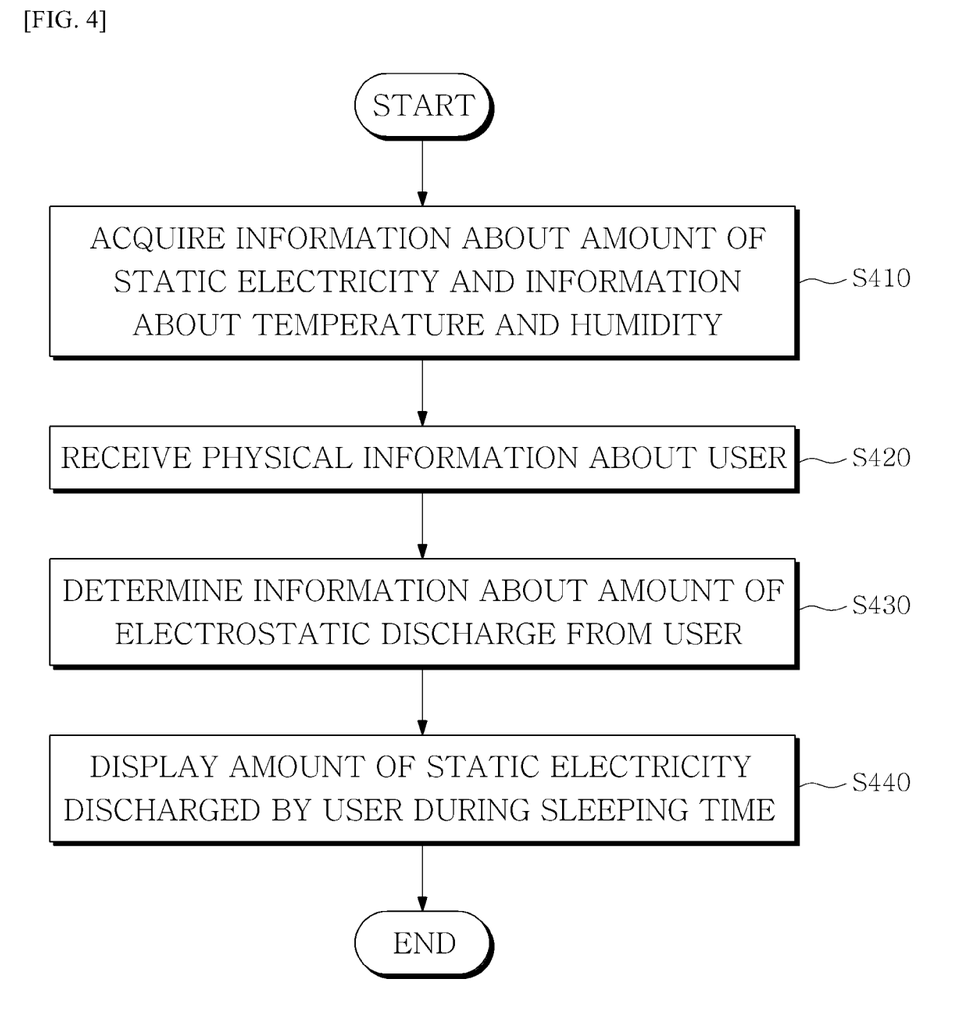
FIG. 4 is a flowchart illustrating the operation of a ground sensing plug for determining the amount of electrostatic discharge using a neural network, according to one embodiment.

FIG. 4 is a flowchart illustrating the operation of a ground sensing plug for determining the amount of electrostatic discharge using a neural network, according to one embodiment. The embodiment of FIG. 4 may be combined with various other embodiments of the present disclosure.

Referring to FIG. 4, in operation S410, the ground sensing plug may acquire information about the amount of static electricity and information about temperature and humidity through a sensor unit connected to the ground sensing plug.

For example, the sensor unit may be a sensor unit included in the earthing mat described above. The information about the amount of static electricity may include a value for the amount of static electricity per area of the user's body measured by the sensor unit during the sleeping time and a value for a distance between the user and the sensor unit. For example, the sleeping time may be determined as a period of time from a first time when the pressure sensed by the sensor unit is above a preset value to a second time when the pressure sensed by the sensor unit is determined to be below the preset value. For example, when the user is lying on the earthing mat, the sensor unit included in the earthing mat may sense the pressure exerted by the user. In this case, the time period from the first time when the pressure sensed by the sensor unit is above the preset value to the second time when the pressure sensed by the sensor unit is determined to be below the preset value may be determined as the sleeping time. For example, the preset value may be determined based on the weight of the user. Also, when the period of time from the first time when the pressure sensed by the sensor unit is above the preset value to the second time when the pressure sensed by the sensor unit is determined to be below the preset value is greater than a preset time, the period of time from the first time to the second time may be determined to be a sleeping time. For example, the preset time may be 30 minutes. For example, the value for the distance between the user and the sensor unit may vary depending on the thickness of the fabric included in the earthing mat described above. In other words, as the thickness of the fabric included in the earthing mat increases, the value for the distance between the user and the sensor unit may increase. In this case, the sensor unit may measure the distance between the user and the sensor unit through the IR sensor included in the sensor unit. For example, the distance between the user and the sensor unit may be measured by a time of arrival (TOA) scheme using infrared light emitted from the IR sensor.

The information about the temperature and humidity may include the temperature measured by the sensor unit during the sleeping time and the humidity measured by the sensor unit during the sleeping time.

For example, based on the grounded state being detected by the ground sensing plug, the plurality of light emitting diodes may emit green light. For example, based on the plurality of light-emitting diodes emitting green light, the ground sensing plug may acquire information about the amount of static electricity and information about the temperature and humidity through the sensor unit connected to the ground sensing plug. That is, when the ground sensing plug is electrically connected to the earth terminal, the ground sensing plug may acquire information about the amount of static electricity and information about the temperature and humidity through the sensor unit connected to the ground sensing plug.

Thus, the ground sensing plug may determine the amount of static electricity discharged by the user based on the amount of static electricity measured in the grounded state.

In operation S420, the ground sensing plug may receive physical information about a user from a user terminal having established a connection with the ground sensing plug.

For example, the ground sensing plug may pre-establish a wireless connection with the user terminal through a user interface installed on the user terminal. After the wireless connection with the user terminal is established, based on the plurality of light emitting diodes emitting green light, the ground sensing plug may make a request to the user terminal for the physical information about the user, and receive the physical information about the user from the user terminal.

The physical information about the user may include a height of the user, a weight of the user, a gender of the user, an age of the user, a value for an average heart rate of the user, and a value for an average oxygen saturation of the user. For example, the value for the average heart rate of the user and the value for the average oxygen saturation of the user may be values measured by the user terminal.

In operation S430, the ground sensing plug may determine the information about the amount of electrostatic discharge from the user using a model for determining the amount of electrostatic discharge using a neural network based on the information about the amount of static electricity, the information about the temperature and humidity, and the physical information about the user. The information about the amount of electrostatic discharge from the user may include a total amount of electrostatic discharge from the user for the sleeping time and the amount of electrostatic discharge from each body region of the user for the sleeping time.

For example, the body regions of the user may include a first region corresponding to a head region of the user, a second region corresponding to a torso region of the user, a third region corresponding to a right arm region of the user, a fourth region corresponding to a left arm region of the user, a fifth region corresponding to a right leg region of the user, and a sixth region corresponding to a left leg region of the user.

For example, the total amount of electrostatic discharge from the user for the sleeping time may be the sum of the amount of electrostatic discharge from each of the user's body regions for the sleeping time.

In other words, the amount of static electricity measured by the sensor unit connected to the ground sensing plug may have a different value from the amount of static electricity discharged from the user depending on the physical information about the user, the ambient temperature, and the humidity. Therefore, in order to accurately determine the amount of static electricity discharged from the user, an electrostatic discharge amount determination model trained by considering not only the amount of static electricity measured by the sensor unit connected to the ground sensing plug, but also the distance between the sensor unit and the user, the physical information about the user, and data about the ambient temperature and humidity may be used.

For example, an input vector may be generated by data preprocessing of the information about the amount of static electricity, the information about the temperature and humidity, and the physical information about the user. Here, the input vector may include values for the amount of static electricity per body region of the user, a value for the distance between the user and the sensor unit, a temperature value per body region of the user, a humidity value per body region of the user, a value for the height of the user, a value for the weight of the user, a value for the gender of the user, a value for the age of the user, a value for the average heart rate of the user, and a value for the average oxygen saturation of the user.

For example, the neural network may include an input layer, one or more hidden layers, and an output layer. The respective training data, each of which includes a plurality of input vectors and a plurality of correct amount of electrostatic discharge for each of the plurality of body regions, may be input to the input layer of the neural network and passed through the one or more hidden layers and the output layer to be output as an output vector. The output vector may be input to a loss function layer connected to the output layer. The loss function layer may output a loss value using a loss function that compares the output vector with a correct vector for the respective training data, and the parameters of the neural network may be trained in such a way that the loss value is reduced. The correct amount of electrostatic discharge per each of the plurality of body regions may be the amount of electrostatic discharge per body region for each of the plurality of input vectors, which may be pre-stored in the ground sensing plug and/or the management server.

For example, based on the input vectors being input to the electrostatic discharge amount determination model, the total amount of electrostatic discharge from the user for the sleep time and the amount of electrostatic discharge from each of the body regions of the user for the sleeping time may be output.

For example, the controller of the ground sensing plug may determine information about the amount of electrostatic discharge from the user through the electrostatic discharge amount determination model using a neural network based on information about the amount of static electricity, information about temperature and humidity, and physical information about the user.

Alternatively, for example, the ground sensing plug may transmit the information about the amount of static electricity, the information about the temperature and humidity, and the physical information about the user to the management server described above. Alternatively, the management server may determine the information about the amount of electrostatic discharge from the user through the electrostatic discharge amount determination model using the neural network, and transmit the determined information about the amount of electrostatic discharge from the user to the ground sensing plug.

In operation S440, the ground sensing plug may display the amount of static electricity discharged by the user during the sleeping time, based on the information about the amount of electrostatic discharge from the user.

For example, the ground sensing plug may display on the display the sleeping time of the user, the total amount of static electricity discharged during the sleeping time, and the amount of static electricity discharged per body region of the user.

According to one embodiment, based on the amount of static electricity discharged by the user during the sleeping time being greater than a reference value, the ground sensing plug and/or the management server may transmit an alert message to the user terminal. The alert message may include information about the sleeping time of the user, a normal amount of electrostatic discharge from the user, and an amount of electrostatic discharge that exceeds the normal amount of electrostatic discharge. The normal amount of electrostatic discharge from the user may be determined for each body region of the user.

For example, the amount of static electricity discharged by the user during the sleeping time may include the total amount of electrostatic discharge or the amount of electrostatic discharge per body region. The reference value may be a reference value for the total amount of electrostatic discharge or the amount of electrostatic discharge per body region.

According to one embodiment, the reference value may be determined based on the physical information about the user. In other words, the reference value may vary depending on the physical information about the user. For example, different reference values may be matched based on the user's height, weight, gender, age, average heart rate, and average oxygen saturation. The reference values based on the user's height, weight, gender, age, average heart rate, and average oxygen saturation may be pre-stored on the ground sensing plug or the management server. For example, in the case of the amount of electrostatic discharge per body region, the reference values may differ among body regions.

For example, the normal amount of electrostatic discharge from the user may be the reference value for the total amount of electrostatic discharge or the reference value for the amount of electrostatic discharge per body region.

For example, the reference value may be determined to be a default value when the number of times the information about the amount of electrostatic discharge from the user is acquired is less than a preset number of times. For example, when the number of times the information about the amount of electrostatic discharge from the user is acquired is greater than or equal to the preset number of times, the reference value may be determined as an average value based on the acquired information about the amount of electrostatic discharge from the user. Here, the average value may include an average value for the total amount of electrostatic discharge or an average value for the amount of electrostatic discharge per body region. For example, the preset number of times may be 10.

For example, the value for the body region having the largest measured amount of static electricity and the value for the coordinate region having the largest amount of static electricity in the body region may be determined based on the amount of static electricity per body region of the user. The alert message may further contain a value for the body region having the largest measured amount of static electricity and a value for the coordinate region having the largest amount of static electricity in the body region.

According to one embodiment, the ground sensing plug may further include an earth leakage detector and an emergency battery. The earth leakage detector may detect a leakage current around a power outlet to which the ground sensing plug is connected. For example, based on a leakage current being detected around the connected power outlet, the earth leakage detector may disconnect power supplied to the ground sensing plug from the connected power outlet.

The emergency battery may be an uninterruptible power supply system, and may be used to provide power to the ground sensing plug temporarily in the event that the power supplied to the ground sensing plug is cut off. For example, the emergency battery may be a high-capacity lithium-ion battery.

For example, based on the power supplied to the ground sensing plug being cut off, the ground sensing plug may send a leakage notification message to the user terminal using the power supplied from the emergency battery. Here, the leakage notification message is a message notifying that an electric leakage has occurred, and may contain information about a time at which the electric leakage occurred.

Figure 5:
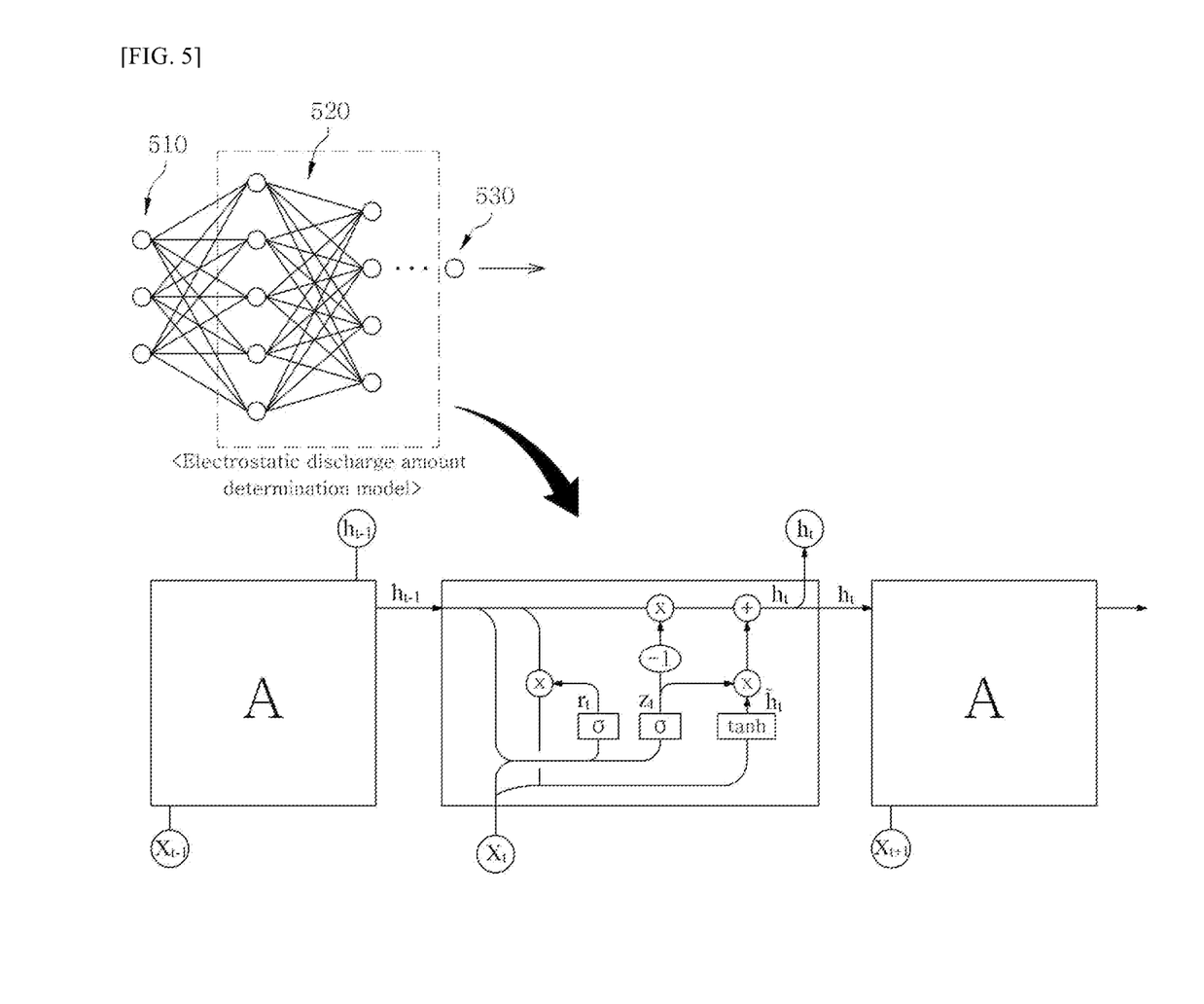
FIG. 5 shows an exemplary model for determining the amount of electrostatic discharge, according to one embodiment.

FIG. 5 shows an exemplary model for determining the amount of electrostatic discharge, according to one embodiment. The embodiment of FIG. 5 may be combined with various embodiments of the present disclosure.

Referring to FIG. 5, the electrostatic discharge amount determination model may be a gated recurrent unit (GRU)-based neural network model. Here, the GRU may be a variant of a recurrent neural network (RNN). In general, the RNN may effectively model time-series information because the hidden layer values for the previously stored inputs are considered in the output for the next input value. However, since the RNN relies on past observations, it may have a vanishing gradient or an exploding gradient. A model to address this issue is long short term memory networks (LSTM). By replacing the nodes in the LSTM with memory cells, information may be accumulated or a portion of the past information may be deleted, compensating for the above issues with the RNN. However, the LSTM has the disadvantage of using three gates (input gate, delete gate, and output gate), which leads to slightly slower processing. A model that addresses the speed issue of the LSTM by using two gates (update gate and reset gate) is the GRU model.

The neural network may include an input layer 510, one or more hidden layers 520, and an output layer 530.

For example, an input vector may be generated by data preprocessing of the information about the amount of static electricity, the information about the temperature and humidity, and the physical information about the user. Here, the input vector may include values for the amount of static electricity per body region of the user, a value for the distance between the user and the sensor unit, a temperature value per body region of the user, a humidity value per body region of the user, a value for the height of the user, a value for the weight of the user, a value for the gender of the user, a value for the age of the user, a value for the average heart rate of the user, and a value for the average oxygen saturation of the user.

For example, the one or more hidden layers 520 may include one or more GRU blocks. A GRU block may include a reset gate and an update gate. Here, the reset gate and the update gate may include a $$si\left(\frac{1}{1+e^{-x}}\right).$$

For example, the sigmoid layer may be a layer where the sigmoid function is the activation function. For example, the hidden state may be controlled by the reset gate and update gate, and there may be weights according to each gate and input.

The respective training data, each composed of a plurality of input vectors and a plurality of correct amounts of electrostatic discharge per body region, is input to the input layer 510 of the neural network and passed through the one or more hidden layers 520 and the output layer 530 to be output as an output vector, wherein said output vector is input to a loss function layer connected to said output layer 530. The loss function layer outputs a loss value using a loss function that compares the output vector with the correct vector for the respective training data, and the parameters of the neural network may be trained in such a way that the loss value is reduced.

Here, the correct amount of electrostatic discharge per body region may be a correct answer vector representing the amount of electrostatic discharge per body region corresponding to one input vector. In other words, the neural network may collect a plurality of training sets composed of the correct amount of electrostatic discharge per body region corresponding to the input vector. The neural network may be trained based on the plurality of collected training sets.

Specifically, for example, the reset gate may reset the past information, and the weight r(t) derived from the previous hidden layer may be determined by Equation 1.

$$r_t = \sigma(W_r \cdot x_t + U_r \cdot h_{(t-1)}) \qquad \text{[Equation 1]}$$

For example, when a plurality of input vectors is input to the input layer 510, and the reset gate receives an input value $x_t$ at the current time generated based on the plurality of input vectors, the reset gate may obtain a value by taking the inner product of the input value and the weight $W_r$ at the current time and obtain a value by taking the inner product of the hidden state at the previous time, $h_{(t-1)}$, generated based on the plurality of input vectors, and the weight $U_r$ at the previous time. Finally, the sum of the two values may be input to the sigmoid function, which may output a value between 0 and 1 as a result. This value between 0 and 1 may determine how much of the hidden state value at the previous time will be utilized.

The update gate may determine the update rate for past and present information, where z(t) is the amount of information at the current time and may be determined by Equation 2.

$$z(t) = \sigma(W_z \cdot x_t + U_z \cdot h_{(t-1)}) \qquad \text{[Equation 2]}$$

For example, when the input value $x_t$ at the current time is input, A value may be obtained by taking the inner product of the input value and the weight $W_z$ at the current time, and a value may be obtained by taking the inner product of the hidden state $h_{(t-1)}$ at the previous time and the weight $U_z$ at the previous time. Finally, the sum of the two values may be input to the sigmoid function, and a value between 0 and 1 may be output as a result. Then, 1−z(t) may be multiplied by the information in the hidden layer at the last time, $h_{(t-1)}$.

In this way, z(t) may reflect how much to use current information and how much to use 1−z(t) for past information.

By multiplying the result of the reset gate, an information candidate at the current time t may be determined by Equation 3.

$$\tilde{h}(t) = \tanh(W_h \cdot x_t + r * U_h \cdot h_{(t-1)}) \quad \text{[Equation 3]}$$

For example, when the input value $x_t$ at the current time is input, the sum of the value obtained by the inner product of the input value and the weight $W_h$ at the current time, and the value obtained by multiplying the inner product of the hidden state $h_{(t-1)}$ at the previous time and the weight $U_h$ at the previous time by r(t) may be input to the tan h function.

By combining the results of the update gate and the candidates, the weight of the hidden layer at the current time may be determined by Equation 4.

$$h(t) = (1 - z(t)) * h_{(t-1)} + z(t) * \tilde{h}(t)) \quad \text{[Equation 4]}$$

For example, the weight of the hidden layer at the current time may be determined as the sum of the value obtained by multiplying the output value z(t) of the update gate by the hidden state h(t) at the current time and the value obtained by multiplying the value 1−z(t) discarded by the update gate by the hidden state h(t−1) at the previous time.

For example, dropout may be applied to a neural network used in the electrostatic discharge amount determination model. Here, the dropout is a technique for removing neurons from interconnected layers with a probability between 0 and 1. For example, the dropout rate may be set to 0.5. In this case, when four neurons are present in a particular layer, they may be randomly removed with a probability of 0.5 for each of the four neurons. This may prevent overfitting of the pseudo-scoring model.

Thus, the parameters of the neural network trained by the electrostatic discharge amount determination model may be used. The electrostatic discharge amount determination model may quickly output the amount of electrostatic discharge from the user while taking into account various parameters that affect the actual amount of electrostatic discharge.

Figure 6:
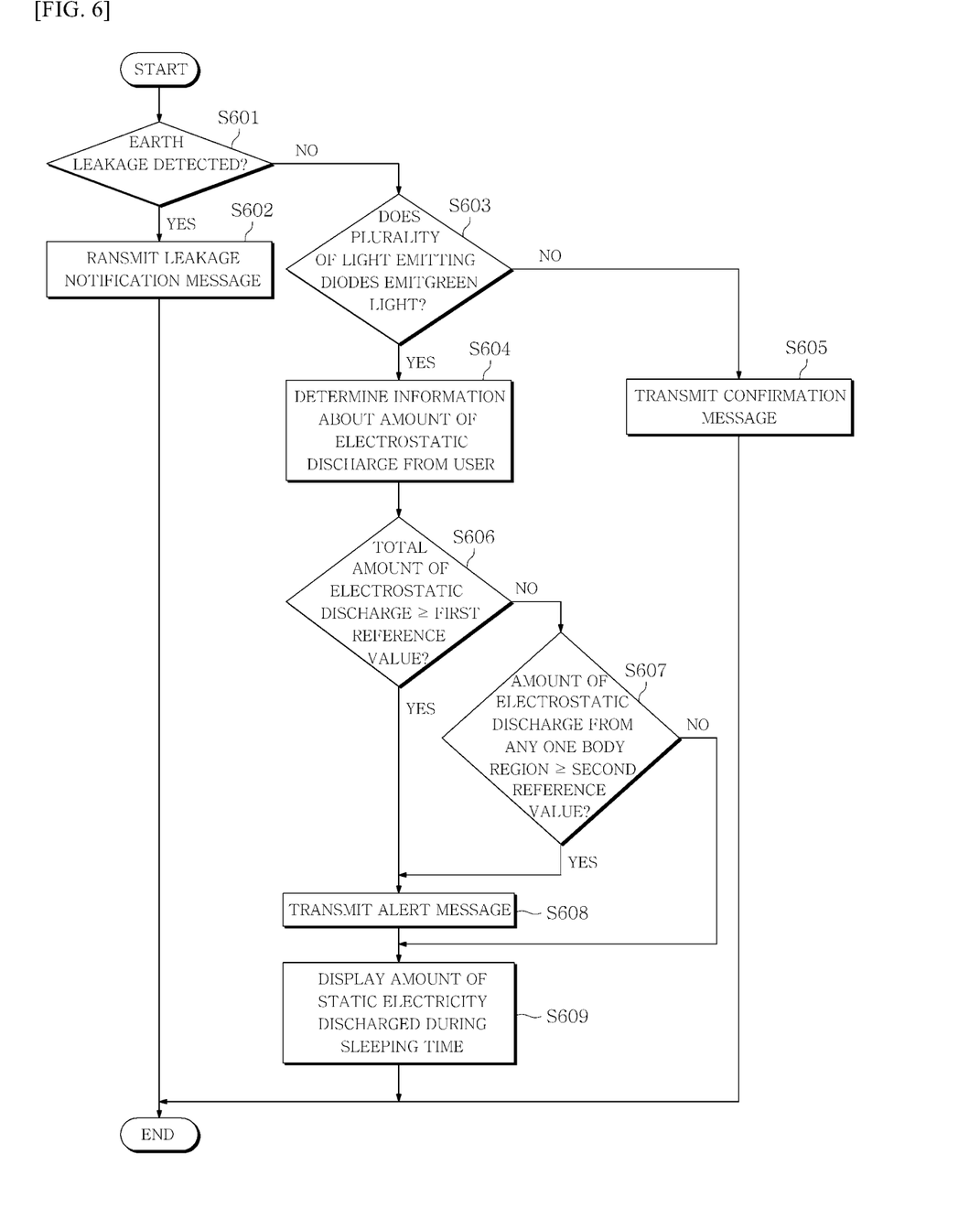
FIG. 6 is a flowchart illustrating a specific operation of a ground sensing plug for determining the amount of electrostatic discharge using a neural network, according to one embodiment.

FIG. 6 is a flowchart illustrating a specific operation of a ground sensing plug for determining the amount of electrostatic discharge using a neural network, according to one embodiment. The embodiment of FIG. 6 may be combined with various embodiments of the present disclosure.

Referring to FIG. 6, in operation S601, the ground sensing plug may detect whether a current is leaking around the power outlet to which the ground sensing plug is connected.

For example, the ground sensing plug may detect a leakage of current around the power outlet to which the ground sensing plug is connected using the earth leakage detector.

In operation S602, when a leakage current is detected, the ground sensing plug may transmit a leakage notification message to the user terminal.

For example, based on a leakage current being detected around the connected power outlet, the earth leakage detector may disconnect power supplied to the ground sensing plug from the connected power outlet. For example, based on the power supplied to the ground sensing plug being cut off, the ground sensing plug may send a leakage notification message to the user terminal using the power supplied from the emergency battery.

In operation S603, when the leakage current is not detected, the ground sensing plug may determine whether the plurality of light emitting diodes emits green light.

For example, in the case where no leakage current is detected, when the ground sensing plug is electrically connected to the earth terminal, the plurality of light emitting diodes may emit green light, and the ground sensing plug may be determined to be grounded.

For example, in the case where no leakage current is detected, when the ground sensing plug is electrically disconnected from the earth terminal, the plurality of light emitting diodes may emit red light, and the ground sensing plug may be determined to be ungrounded.

In operation S604, based on the green light being emitted, the ground sensing plug may determine information about the amount of electrostatic discharge from the user through a model for determining the amount of electrostatic discharge using a neural network based on information about the amount of static electricity, information about temperature and humidity, and physical information about the user.

In operation S605, based on the red light being emitted, the ground sensing plug may transmit a confirmation message to the user terminal. The confirmation message may indicate that the power outlet to which the ground sensing plug is connected is ungrounded, and may contain, for example, information about a time when the ungrounded state was detected.

In operation S606, the ground sensing plug may determine whether the total amount of electrostatic discharge from the user for the sleeping time is greater than or equal to a first reference value. For example, the first reference value may be a reference value for the total amount of electrostatic discharge and may be determined based on information about the amount of static electricity, physical information about the user, and information about temperature and humidity.

Additionally, for example, the first reference value may be determined by Equation 5 below.

$$E_{th1} = \left(1.75 - \frac{5\alpha * h^2 * r_d - r * w}{w * r_d}\right) * \frac{V_{d1}}{1 + m * \sqrt{c}} \quad \text{[Equation 5]}$$

In Equation 5, $E_{th1}$ may be the first reference value, a may be a weight based on the age of the user and the gender of the user, h may be a value for the height of the user, w may be a value for the weight of the user, r may be a value for the distance between the sensor unit and the user, $r_d$ may be a default value for the distance, m may be a value for the humidity, c may be a value for the temperature, and $V_{d1}$ may be a default voltage for the first reference value.

For example, the default value for distance and the default voltage for the first reference value may be pre-stored in the ground sensing plug and/or the management server.

For example, a may have a larger value as the age of the user is closer to 35 years old. In this case, when the user has the same age but a different gender, α may have a greater value when the user's gender is male than when the user's gender is female. α may be greater than 0 and less than 1.5.

For example, when the normal amount of electrostatic discharge from the user is the total amount of electrostatic discharge from the user, the normal amount of electrostatic discharge from the user may be determined as the first reference value.

In this way, the first reference value may not always be set to a fixed value, but may be set to an appropriate reference value in consideration of the physical information about the user, the temperature and humidity of the environment, and the distance between the sensor unit and the user.

For example, the first reference value may be determined as a default value when the number of times the information about the amount of electrostatic discharge from the user is acquired is less than a preset number of times. For example, when the number of times the information about the amount of electrostatic discharge from the user is acquired is greater than or equal to the preset number of times, the reference value may be determined as an average value according to the acquired information about the amount of electrostatic discharge from the user. Here, the average value may include an average value for the total amount of electrostatic discharge or an average value for the amounts of electrostatic discharge from different body regions. For example, the preset number of times may be 10.

In operation S607, based on the total amount of electrostatic discharge from the user for the sleeping time being less than the reference value, the ground sensing plug may determine whether the amount of electrostatic discharge from any one of the plurality of body regions is greater than or equal to a second reference value. The plurality of body regions may include a first region corresponding to a head region of the user, a second region corresponding to a torso region of the user, a third region corresponding to a right arm region of the user, a fourth region corresponding to a left arm region of the user, a fifth region corresponding to a right leg region of the user, and a sixth region corresponding to a left leg region of the user.

Additionally, for example, the second reference value may be determined by Equation 6 below.

$$E_{th2} = \left(1.75 - \frac{5\alpha * h^2 * r_d - r * w}{w * r_d}\right) * \frac{V_{d2}}{1 + m * \sqrt{c}} \quad \text{[Equation 6]}$$

In Equation 6, $E_{th2}$ may be the second reference value, a may be a weight based on the age of the user and the gender of the user, h may be a value for the height of the user, w may be a value for the weight of the user, r may be a value for the distance between the sensor unit and the user, $r_d$ may be a default value for the distance, m may be a value for the humidity, c may be a value for the temperature, and $V_{d2}$ may be a default voltage for the second reference value.

For example, the default value for the distance and the default voltage for the second reference value may be pre-stored in the ground sensing plug and/or the management server. In this case, the default voltage for the second reference value may have different values for different body regions. For example, for a larger body region, the default voltage for the second reference value may be set to a greater value. Further, the second reference value may be set for each body region.

For example, when the normal amount of electrostatic discharge from the user is the amount of discharge per body region of the user, the normal amount of electrostatic discharge from the user may be determined as the second reference value per body region.

In this way, the second reference value may not always be set to a fixed value, but may be set to an appropriate reference value in consideration of the physical information about the user, the temperature and humidity of the environment, and the distance between the sensor unit and the user.

For example, the second reference value may be determined as a default value when the number of times the information about the amount of electrostatic discharge from the user is acquired is less than a preset number of times. For example, when the number of times the information about the amount of electrostatic discharge from the user is acquired is greater than or equal to the preset number of times, the reference value may be determined as an average value according to the acquired information about the amount of electrostatic discharge from the user. Here, the average value may include an average value for the total amount of electrostatic discharge or an average value for the amounts of electrostatic discharge from different body regions. For example, the preset number of times may be 10.

In step S608, where the total amount of electrostatic discharge from the user for the sleeping time is greater than or equal to the first reference value, the ground sensing plug may transmit an alert message to the user terminal.

Alternatively, for example, when the total amount of electrostatic discharge from the user for the sleeping time is less than the first reference value, and the amount of electrostatic discharge from any one of the plurality of body regions is greater than or equal to the second reference value, the ground sensing plug may transmit an alert message to the user terminal.

In operation S609, the ground sensing plug may display the amount of static electricity discharged during the sleeping time.

For example, the ground sensing plug may display on the display the sleeping time of the user, the total amount of static electricity discharged during the sleeping time, and the amount of static electricity per body region of the user during the sleeping time.

The embodiments described above may be implemented by hardware components, software components, and/or a combination of hardware components and software components. For example, the apparatus, method, and components described in the embodiments may be implemented using one or more general purpose or special purpose computers such as, for example, a processor, a controller, an arithmetic logic unit (ALU), a digital signal processor, a microcomputer, a field programmable gate array (FPGA), a programmable logic unit (PLU), microprocessors, or any other device capable of executing and responding to instructions. A processing unit may run an operating system (OS) and one or more software applications executed on the OS. The processing unit may also access, store, manipulate, process, and generate data in response to execution of software. While it is described for convenience of understanding that one processing unit is used, those skilled in the art will understand that the processing unit may include a plurality of processing elements and/or a plurality of types of processing elements. For example, the processing unit may include a plurality of processors or one processor and a controller. Other processing configurations such as parallel processors are also possible.

Software may include a computer program, code, instructions, or a combination of one or more of the foregoing, and may configure a processing unit to operate as desired or independently or collectively instruct the processing unit. Software and/or data may be permanently or temporarily embodied in any type of machine, component, physical device, virtual equipment, computer storage medium or device, or a transmitted signal wave in order to be interpreted by or provide instructions or data to a processing unit. Software may be distributed on networked computer systems and may be stored or executed in a distributed manner. The software and data may be stored on one or more computer-readable media.

The method according to the embodiment may be implemented in the form of program instructions that may be executed through various computer means and recorded on a computer-readable medium. The computer-readable medium may include program instructions, data files, and data structures alone or in combination. The program instructions recorded on the medium may be specially designed and configured for the embodiments or may be known and available to those skilled in computer software. Examples of the computer-readable recording media include magnetic media such as hard disks, floppy disks and magnetic tapes, optical media such as CD-ROMs and DVDs, magnetio-optical media such as floptical disks, and hardware devices specially configured to store and execute program instructions, such as ROM, RAM, and flash memory. Examples of program instructions include high-level language codes that may be executed by a computer using an interpreter, as well as machine language codes such as those produced by a compiler. The hardware devices described above may be configured to operate as one or more software modules to perform the operations of the embodiments, and vice versa.

As is apparent from the above description, the present disclosure provides the following effects.

According to embodiments, the ground sensing plug may intuitively indicate to a user whether the plug is grounded or not, based on a plurality of light emitting diodes emitting green light or red light.

According to embodiments, the ground sensing plug may indicate the substantial amount of electrostatic discharge emitted by the user during sleep by determining information about the amount of electrostatic discharge of the user through a model for determining the amount of electrostatic discharge using a neural network based on information about the amount of electrostatic discharge, information about temperature and humidity, and information about the user's body, based on a plurality of light emitting diodes emitting green light.

Effects that can be obtained in the embodiments of the present disclosure are not limited to the effects mentioned above, and other effects not mentioned will be clearly derived and understood by those of ordinary skill in the art from the following detailed description.

As disclosed above, the embodiments have been described by limited drawings. However, those skilled in the art may apply various technical modifications and variations based on the above. For example, the described techniques may be carried out in an order different from the method described, and/or components of the described system, structure, apparatus, circuit, and the like may be coupled or combined in a different form than the method described, or replaced or substituted by other components or equivalents that may achieve appropriate results.

Therefore, other implementations, other embodiments, and equivalents of the claims are within the scope of the accompanying claims.

What is claimed is:

1. A ground sensing plug for determining an amount of electrostatic discharge using a neural network, comprising:
   a first plug terminal configured to receive power from a power outlet connected thereto;
   a second plug terminal configured to have two recesses exposed to an outside to perform a function of an earth terminal;
   a controller comprising at least one processor, a memory, a communication unit, and circuitry electrically connected to the first plug terminal and the second plug terminal;
   a display comprising a display panel and a plurality of light emitting diodes electrically connected to the circuitry, wherein the plurality of light emitting diodes are configured to emit green light based on a grounded state being detected by the ground sensing plug; and
   a housing arranged to enclose the controller,
   wherein the controller is configured to:
   acquire, based on the plurality of light emitting diodes emitting green light, information about an amount of static electricity and information about temperature and humidity through a sensor unit connected to the ground sensing plug;
   receive, based on the plurality of light emitting diodes emitting the green light, physical information about a user from a user terminal of the user having a connection established with the ground sensing plug;
   determine information about an amount of electrostatic discharge from the user through an electrostatic discharge amount determination model using the neural network, based on the information about the amount of static electricity, the information about the temperature and humidity, and the physical information about the user; and
   display on the display an amount of static electricity discharged by the user during a sleeping time of the user based on the information about the amount of electrostatic discharge from the user.

2. The ground sensing plug of claim 1, wherein, based on the amount of static electricity discharged from the user during the sleeping time being greater than or equal to a reference value, an alert message is transmitted to the user terminal,
   wherein the sleeping time is determined as a period of time from a first time when a pressure sensed by the sensor unit is greater than or equal to a preset value to a second time when the pressure sensed by the sensor unit is determined to be less than or equal to a preset value,
   wherein the alert message contains information about the sleeping time of the user, a normal amount of electrostatic discharge for the user, and an amount of discharged static electricity exceeding the normal amount of electrostatic discharge.

3. The ground sensing plug of claim 2, wherein the information about the amount of static electricity comprises a value for the amount of static electricity per body region of the user measured by the sensor unit during the sleeping time and a value for a distance between the user and the sensor unit,
   wherein a body region having a greatest value of the measured amount of static electricity and a value for a coordinate region having a greatest value of the amount of static electricity in the body region are determined based on the amount of static electricity per body region of the user, wherein the alert message further contains the body region having the greatest value of the measured amount of static electricity and the value for the coordinate region having the greatest value of the amount of static electricity in the body region.

4. The ground sensing plug of claim 3, further comprising:

an earth leakage detector and an emergency battery, wherein the earth leakage detector is configured to:

detect a leakage current around the connected power outlet;

based on the leakage current being detected around the connected power outlet, cut off power supplied to the ground sensing plug from the connected power outlet; and transmit, based on the power supplied to the ground sensing plug being cut off, a leakage notification message to the user terminal using power supplied by the emergency battery.

5. The ground sensing plug of claim 3, wherein the information about the temperature and humidity comprises a temperature measured by the sensor unit during the sleeping time and a humidity measured by the sensor unit during the sleeping time, wherein the physical information about the user comprises a height of the user, a weight of the user, a gender of the user, an age of the user, a value for an average heart rate of the user, and a value for an average oxygen saturation of the user, wherein an input vector is generated by data preprocessing of the information about the amount of static electricity, the information about the temperature and humidity, and the physical information about the user, wherein the input vector comprises values for the amount of static electricity per body region of the user, a value for the distance between the user and the sensor unit, a temperature value per body region of the user, a humidity value per body region of the user, the value for the height of the user, the value for the weight of the user, the value for the gender of the user, the value for the age of the user, the value for the average heart rate of the user, and the value for the average oxygen saturation of the user, wherein the neural network comprises an input layer, one or more hidden layers, and an output layer, wherein:

training data each comprising a plurality of input vectors and a plurality of correct amount of electrostatic discharge from each body region is input to the input layer of the neural network and passed through the one or more hidden layers and output layer to provide an output vector;

the output vector is input to a loss function layer connected to the output layer;

the loss function layer outputs a loss value using a loss function configured to compare the output vector with a correct vector for each of the training data; and parameters of the neural network are trained such that the loss value is reduced, wherein, based on the input vector being input to the electrostatic discharge amount determination model, a total amount of electrostatic discharge from the user and the amount of electrostatic discharge from each body region of the user are output, wherein the information about the amount of electrostatic discharge from the user comprises the total amount of electrostatic discharge from the user for the sleeping time and the amount of electrostatic discharge from each body region of the user for the sleeping time.

* * * * *